United States Patent [19]

Ishii

[11] Patent Number: 5,534,769
[45] Date of Patent: Jul. 9, 1996

[54] SYNCHRONOUS RECTIFYING CIRCUIT

[75] Inventor: Masanori Ishii, Tsurugashima, Japan

[73] Assignee: Toko, Inc., Japan

[21] Appl. No.: 245,594

[22] Filed: May 18, 1994

[30] Foreign Application Priority Data

May 21, 1993 [JP] Japan ................................. 5-031957

[51] Int. Cl.⁶ .................................................. H02M 3/157
[52] U.S. Cl. ............................................ 323/283; 323/287
[58] Field of Search ....................................... 323/282, 283, 323/287, 289

[56] References Cited

U.S. PATENT DOCUMENTS

| 4,727,308 | 2/1988 | Huljak et al. ................. 323/287 X |
| 5,072,171 | 12/1991 | Eng ................................... 323/283 |
| 5,481,178 | 1/1996 | Wilcox et al. ....................... 323/287 |

*Primary Examiner*—Peter S. Wong
*Assistant Examiner*—Y. Jessica Han
*Attorney, Agent, or Firm*—Dvorak and Traub

[57] ABSTRACT

A synchronous rectifying circuit for a switching power supply is disclosed which is arranged such that the necessity to provide a diode element in parallel with a rectifying transistor is eliminated so that a highly efficient and stable operation can be achieved. "On" drive signal of a switching transistor (Q1) is detected by a first limiter circuit (6), and a flip-flop circuit (5) causes a rectifying transistor (Q2) to be turned off in response to output of the first limiter circuit (6); turning-off operation of the switching transistor (Q1) is detected by a second limiter circuit (7), and the flip-flop circuit (5) causes the rectifying transistor (Q2) to be turned on in response to output of the second limiter circuit (7). The necessity to provide a diode element in parallel with the rectifying transistor is eliminated. Stable operation can be performed even if the switching element has an indefinite operation delay time. An enhanced efficiency can be achieved.

5 Claims, 4 Drawing Sheets

SYNCHRONOUS RECTIFYING CIRCUIT

BACKGROUND OF THE INVENTION

1. Field of the Invention

The present invention relates to a driving circuit for a rectifying transistor in a rectifying circuit using a transistor as a rectifying element.

2. Description of the Prior Art

With a rectifying circuit using a transistor as a rectifying element, it is known in the art that a higher efficiency is achieved by virtue of the fact that "on" voltage of the transistor is lower than forward drop-down voltage of a diode.

Referring to FIG. 1 of the accompanying drawings, there is illustrated a conventional basic switching power supply circuit which includes a rectifying circuit using MOS FET as rectifying element.

In FIG. 1, a switching transistor Q3 constituted by a P-channel type MOS FET, and smoothing choke coil L1 are connected in series with each other between an input terminal 1 and an output terminal 2; a smoothing capacitor C1 is provided between the output terminal 2 side end of the choke coil L1 and the ground: and a rectifying transistor Q2 constituted by an N-channel type MOS FET is provided between the switching transistor Q3 side end of the choke coil L1 and the ground. This circuit arrangement forms a back type DC—DC converter.

The switching transistor Q3 and rectifying transistor Q2 have their gates connected to the DR1 drive output terminal and DR2 drive output terminal of a dual-drive type PWM circuit 3b, respectively.

The PWM circuit 3b causes the switching transistor Q3 to be driven to achieve switching action, while at the same time causing the rectifying transistor Q2 to be on-off controlled, as a result of which a stabilized DC output is provided to a load $R_L$ via the output terminal 2.

The switching transistor Q3 and rectifying transistor Q2 are arranged to be alternately turned on and off in succession. Actually, however, the arrangement is made such that when the switching transistor Q3 is turned on while the rectifying transistor Q2 is turned off and vice versa, there occurs such an interval that the switching transistor Q3 and rectifying transistor Q2 are both in the "off" state, for the purpose of preventing an excessive short-circuit current from flowing as a result of both the switching transistor Q3 and the rectifying transistor Q2 being in the "on" state.

Disadvantageously, however, a surge current tends to flow in the circuit when both the switching transistor Q3 and the rectifying transistor Q2 are in the "off" state at the same time.

To prevent flow of such a surge current, it has been the usual practice either to provide a diode D1 in parallel with the rectifying transistor Q2 as illustrated in FIG. 1, or to provide a diode element in parallel with both the switching transistor Q3 and the rectifying transistor Q2.

FIG. 2 illustrates various current waveforms which flow in the DC—DC converter circuit of FIG. 1 wherein the diode D1 is provided in parallel with the rectifying transistor Q2.

When both the switching transistor Q3 and the rectifying transistor Q2 are in the "off" state, a voltage is induced in the the choke coil L1 so that a current $I_3$ is permitted to flow through the diode D1 toward the choke coil L1.

The flow of the current through the diode D1 will result in a higher power loss therein than that occurs in the rectifying transistor which is in the "on" state, due to forward drop-down voltage which is generated in the diode D1.

Ideally, control should be made in such a manner as to prevent the switching transistor Q3 and rectifying transistor Q2 from being in the "on" state at the same time and from being in the "off" state at the same time. Actually, however, a transistor element has a delay time in operation, and such a delay time represents a dispersion which depends on the type and form of the element.

Thus, in view of the versatileness of the circuit, and in an attempt to prevent both the switching transistor Q3 and the rectifying transistor Q3 from beig in the "on" at the same time, it is required that the output of the PWM circuit 3b which drives the transistors, with such an interval that both the switching transistor Q3 and the rectifying transistor Q2 are in the "off" state.

Furthermore, with increasing output of the switching power supply, the current flowing in the circuit is increased so that the diode D1 should have an enhanced forward current capacity.

SUMMARY OF THE INVENTION

Accordingly, it is an object of the present invention to a synchronous rectifying circuit which is designed so as to restrain a maximum possible extent occurrence of such an interval that both the switching transistor and the rectifying transistor are in the "off" state, thereby eliminating the necessity of connecting a diode element in parallel with the rectifying transistor.

Another object of the present invention is to provide a synchronous rectifying circuit which is designed so that the switching transistor and the rectifying transistor are prevented from being in the "on" state at the same time, despite occurrence of indefinite delay time in the operation of the switching transistor.

Still another object of the present invention is to provide a synchronous rectifying circuit for use with a switching power supply, which is so designed as to realize highly efficient and stabilized operation.

Briefly stated, according to the present invention, there is provided a synchronous rectifying circuit for a switching power supply which has achieved the foregoing objects, wherein transistor is used as rectifying element; the rectifying transistor is driven in synchronism with the switching operation of switching element. The synchronous rectifying circuit comprises a first limiter circuit for detecting drive signal of the switching element; a second limiter circuit for detecting the operation of the switching element; and a flip-flop circuit for causing the rectifying transistor to be turned on and off in response to output signals of the first and second limiter circuit, wherein drive signal derived from a control circuit for the switching element to turn on the switching element is detected, and the rectifying transistor is turned off in response thereto; and the turning-on of the switching element is detected, and the rectifying transistor is turned on in response thereto.

As will be appreciated, synchronous rectifying circuit according to the present invention is characterized in that "off" timing of the rectifying transistor is detected on the basis of "on" drive signal of the switching element; and "on" timing of the rectifying transistor is detected on the basis of output off operation of the switching element.

Thus, the synchronous rectifying circuit according to the present invention is arranged such that the switching element and rectifying transistor are prevented from being in the "on" state together and from being in the "off" state together, thereby eliminating the necessity to provide a diode element for preventing surge voltage, in parallel with the rectifying transistor. Such an arrangement is advantageous in that an enhanced efficiency can be achieved by virtue of the fact that there is no current flow through a diode element, and in that stabilized operation can be performed even with a switching power supply using a switching element with an indefinite operation delay time.

Other objects, features and advantages of the present invention will become apparent from the ensuing description taken in conjunction with the accompanying drawings.

DESCRIPTION OF THE PREFERRED EMBODIMENTS

Figure 1:
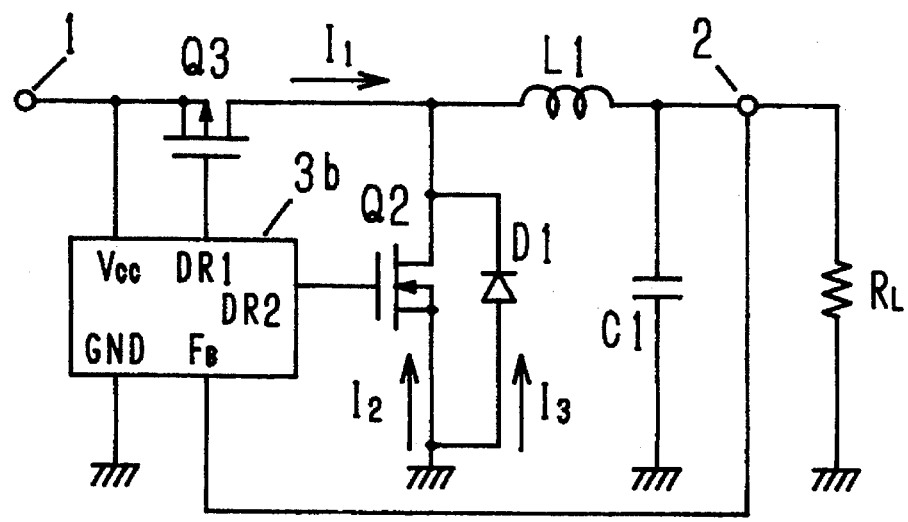
FIG. 1 is a circuit diagram of a conventional basic DC—DC converter using transistor element as rectifying element.
Figure 2:
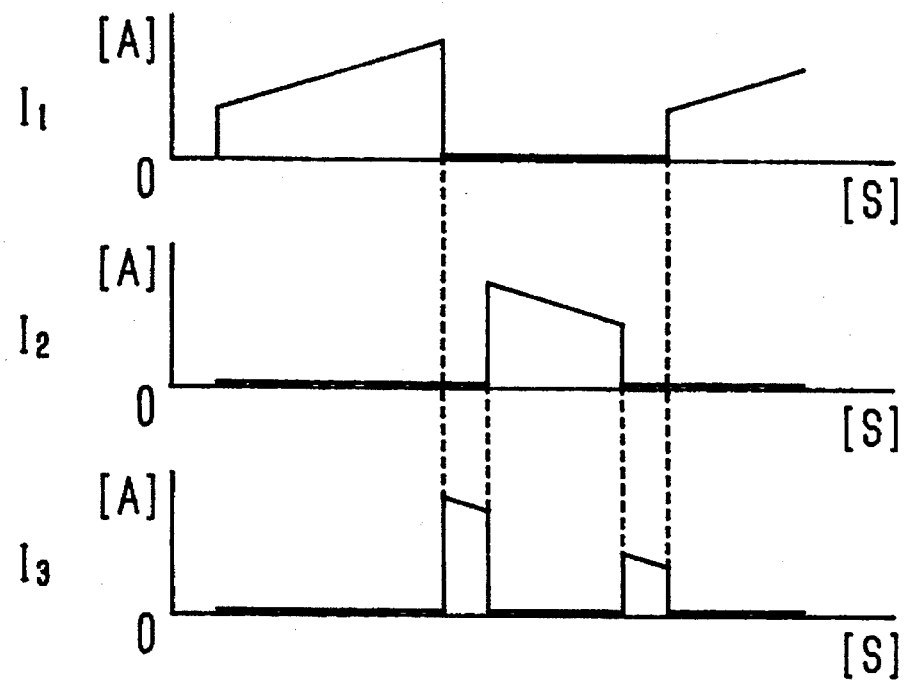
FIG. 2 is current waveforms which occur at various points in the circuit shown in FIG. 1.
Figure 3:
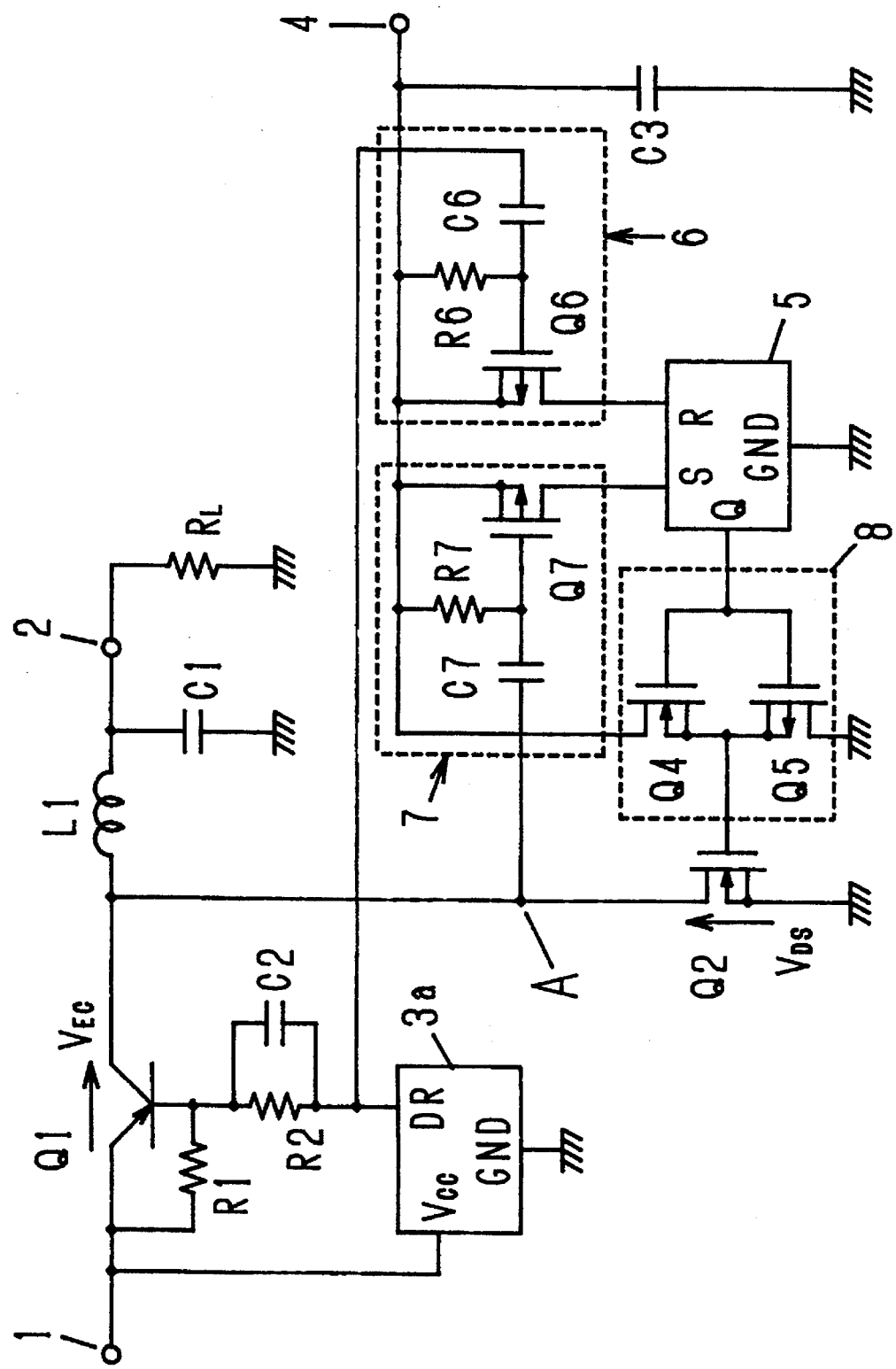
FIG. 3 is a circuit diagram showing an embodiment of the present Invention wherein the synchronous rectifying circuit according to the present invention is applied to a back type DC—DC converter.

Referring to FIG. 3, there is shown a circuit arrangement according to a first embodiment of the present invention wherein the synchronous rectifying circuit according to the present invention is applied to a back type DC—DC converter. In FIG. 3, parts corresponding to those of FIG. 1 are represented by like reference symbols.

The back type DC—DC converter shown in FIG. 3 includes a switching transistor Q1 comprising a PNP transistor and a choke coil L1 which are in series with each other between an input terminal 1 and an output terminal 2; a smoothing capacitor C1 provided between the output terminal 2 side end of the choke coil L1 and the ground; and a rectifying transistor Q2 comprising an N channel type MOS FET which is provided between the switching transistor Q1 side end of the choke coil L1 and the ground.

A resistor R1 is connected between the emitter and the base of the switching transistor Q1, the base of which is coupled to the DR drive output terminal of a single drive type PWM circuit 3a through a parallel circuit of a resistor R2 and capacitor C2. Further, the DR drive output terminal of the PWM circuit 3a is connected to reset input terminal (R) of a flip-flop circuit 5 through a first limiter circuit 6.

The connection point A between the switching transistor Q1 and the rectifying transistor Q2 is coupled to the set input terminal (S) of the flip-flop circuit 5 through a second limiter circuit 7.

Output terminal (Q) of the flip-flop circuit 5 is connected to the gate of the rectifying transistor Q2 through a drive circuit 8.

The first limiter circuit 6 is constituted by a transistor Q6 comprising a P channel type MOS FET, and a resistor R6 and capacitor C6 which form a differentiating circuit. The transistor Q6 has its source connected to an internal power source terminal 4, its drain connected to the reset input terminal of the flip-flop circuit 5 as output terminal of the first limiter circuit 6, and its gate connected to one end of the resistor R6 and one end of the capacitor C6. The other end of the resistor R6 is connected to the internal power source terminal 4, and the other end of the capacitor C6 is coupled to the DR drive output terminal of the PWM circuit 3a as input terminal of the first limiter circuit 6.

The second limiter circuit 7 is constituted by a transistor Q7 comprising a P channel type MOS FET, and a resistor R7 and capacitor C7 which form a differentiating circuit. The connection arrangement of the second limiter circuit 7 is similar to that of the first limiter circuit 6.

The drive circuit 8 is constituted by a transistor Q4 comprising an N channel type MOS FET, and a transistor Q5 comprising a P channel type MOS FET. The transistors Q4 and Q5 have their sources connected together and to the gate of the rectifying transistor Q2 as output terminal of the drive circuit 8. Further, the transistors Q4 and Q5 have theirbases connected together and to the output terminal of the flip flop circuit 5 as input terminal of the drive circuit 8. The drain of the transistor Q4 is connected to the internal power source terminal 4, and the drain of the transistor Q5 is grounded.

A bypass capacitor C3 is shown as connected between the internal power source terminal 4 and the ground. However, such a capacitor C3 is not needed in the case where the internal power source terminal 4 is connected to the input terminal 3 to utilize input voltage $V_{IN}$.

Figure 4:
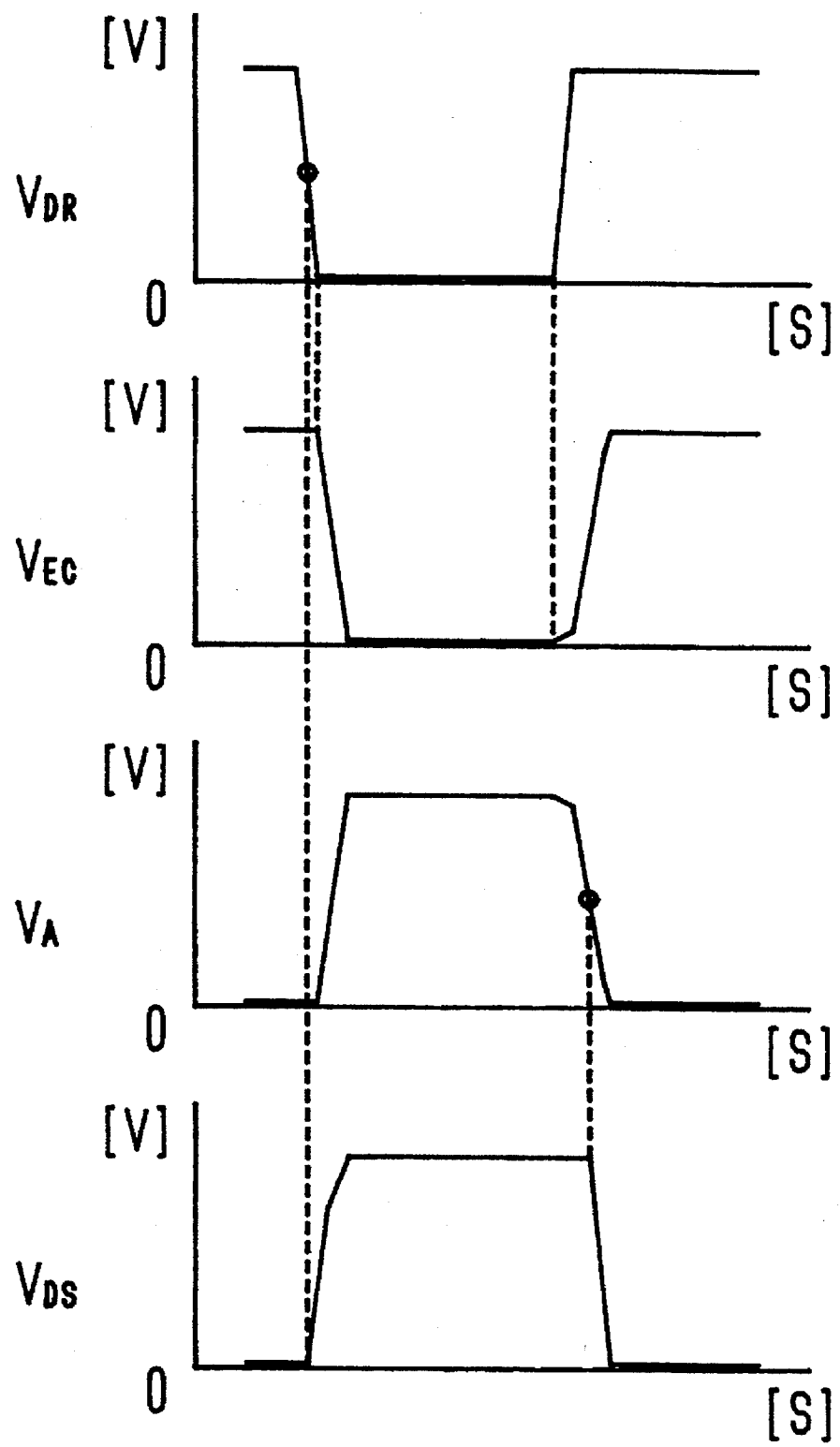
FIG. 4 illustrates voltage waveforms which occur at various points in the circuit shown in FIG. 3.

Description will now be made of the operation of the present synchronous rectifying circuit in the DC—DC converter of FIG. 3, with reference to FIG. 4 illustrating voltage waveforms which occur at various points in the circuit.

In FIG. 4, $V_{DR}$ is output voltage at the DR drive output terminal of the PWM circuit 3a; $V_{EC}$ is voltage between the emitter and the collector of the switching transistor Q1; $V_A$ is voltage at the connection point A; and $V_{DS}$ is voltage between the drain and the source of the rectifying transistor Q2.

First of all, as the voltage $V_{DR}$ at the DR drive output terminal of the PWM circuit 3a falls down, the switching transistor Q1 is turned on.

At this time, the falling-down of the voltage $V_{DR}$ is detected by the differentiating circuit constituted by the resistor R6 and capacitor C6 of the first limiter circuit 6, so that the transistor Q6 is turned on. As a result, a reset signal is inputted to the reset input terminal of the flip-flop circuit 5.

In response to the reset signal, the flip-flop circuit 5 causes the output voltage at the output terminal to fall down so that the rectifying transistor Q2 to which the flip-flop circuit 5 is connected through the drive circuit 8, is turned on. This results in such an operational timing that the rectifying transistor Q2 is turned off while the switching transistor Q1 is being changed over to the "off" state, and subsequently when the switching transistor Q1 is in the "on" state, the rectifying transistor Q2 is in the "off" state.

As the voltage $V_{DR}$ at the DR drive output terminal of the PWM circuit 3a rises up, the switching transistor Q1 is turned off after a lapse of a short delay time.

As a result of the switching transistor Q1 being turned off, the voltage $V_A$ at the connection point A is caused to fall down.

The falling-down of the voltage $V_A$ at the connection point A is detected by the differentiating circuit constituted by the resistor R7 and capacitor C7 of the second limiter circuit 7, so that the transistor Q7 is turned on. Consequently, a set signal is inputted to the set input terminal of the flip-flop circuit 5. In response to the set signal, the flip-flop circuit 5 cases the output voltage at the output terminal to rise up, so that the rectifying transistor Q2 to which the flip-flop circuit 5 is connected through the drive circuit 8, is turned on. This results in such an operational timing that the rectifying transistor Q2 is turned on while the switching transistor Q1 is being changed over to the "on" state, and subsequently when the switching transistor Q1 is in the "off" state, the rectifying transistor Q2 is in the "on" state.

As will be appreciated from the above discussion, with the circuit arrangement according to the present invention, there occurs neither such an interval that the switching transistor Q1 and rectifying transistor Q2 are in the "on" state together nor such an interval that the switching transistor Q1 and rectifying transistor Q2 are in the "off" sate together off at the same time, thereby making it possible to ensure that stabilized operation is performed, while at the same time eliminating the need to provide a diode element in parallel with the rectifying transistor Q2 as with the prior art.

Furthermore, according to the present invention, the arrangement is made such that the "off" timing of the rectifying transistor Q2 is detected on the basis of the output voltage at the DR drive output terminal of the PWM circuit 3a, and the "on" timing thereof is detected on the basis of the voltage which occurs at the connection point A as a result of the switching transistor Q1 being turned off. Thus, it is possible to achieve stabilized operation with the same circuit arrangement, irrespective of whether the switching transistor Q1 comprises an element with a long operational delay time such for example as bipolar type transistor or an element with a short operational delay time such as MOS FET.

Although in the circuit of FIG. 3, the internal power source terminal 4 is provided as a power source supply means for driving the respective circuit elements, it is to be understood that the present invention is by no means limited thereto. It is also possible that power may be supplied directly from the input terminal 1 or power may be supplied to the respective circuit elements through a booster circuit or the like in the case where the input voltage is lower than the drive voltage for the MOS FET.

While in the embodiment shown in FIG. 3, the operation of the synchronous rectifying circuit according to the present invention was described with respect to switching power supply constructed in the form of back type DC—DC converter, it is to be understood that the present invention is equally applicable to other types of DC—DC converter such for example as chop-up type, invert type, flyback type and so forth.

Figure 5:
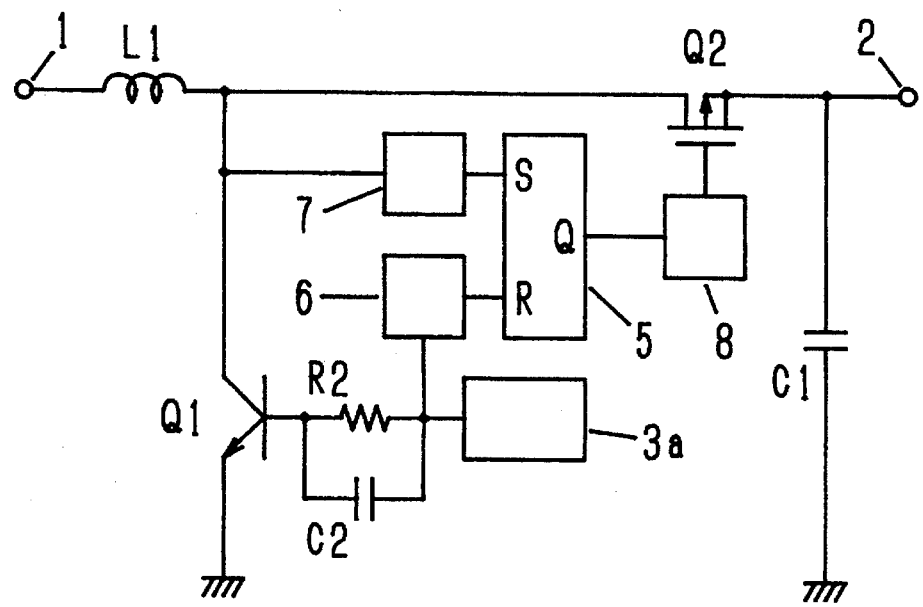
FIG. 5 is a circuit diagram showing a second embodiment of the present invention wherein the synchronous rectifying circuit according to the present invention is applied to a chop-up type DC—DC converter.
Figure 6:
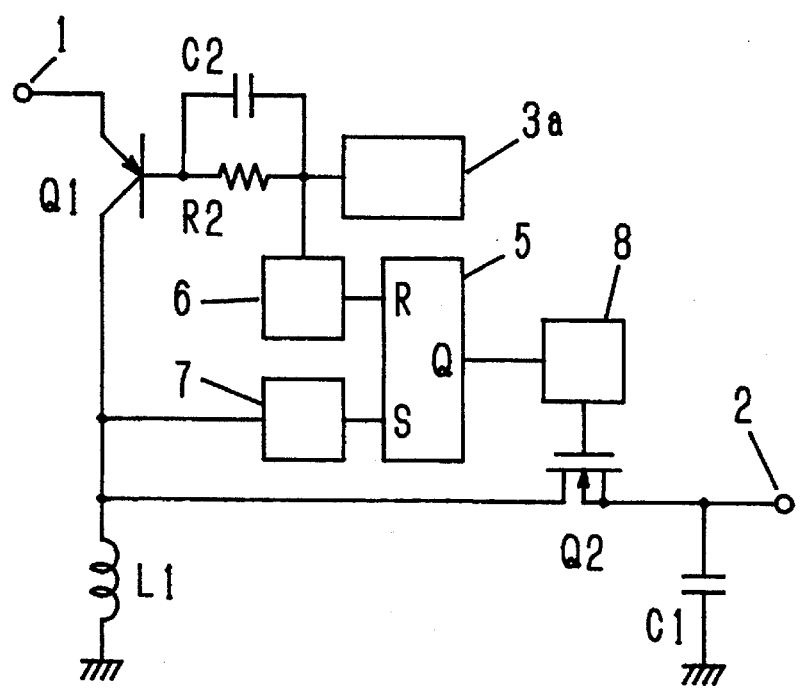
FIG. 6 is a circuit diagram showing a third embodiment of the present invention wherein the the synchronous rectifying circuit according to the present invention is applied to an invert type DC—DC converter.

FIG. 5 illustrates an example of circuit arrangement in which the synchronous rectifying circuit according to the present invention is applied to a chop-up type .DC—DC converter. FIG. 6 shows an example of circuit arrangement in which the synchronous rectifying circuit according to the present invention is applied to a invert type DC—DC converter.

In the circuit arrangement of FIG. 5, a choke coil L1 and a switching transistor Q1 comprising an NPN type transistor are connected in series with each other between the input terminal 1 and the ground, with the emitter of the switching transistor Q1 being at the ground side; the collector of the switching transistor Q1 is coupled to the output terminal 2 through the main current path of the rectifying transistor Q2 comprising a P channel type MOS FET; a smoothing capacitor C1 is provided between the output terminal 2 and the ground; and the base of the switching transistor Q1 is connected to the drive output terminal of the PWM circuit 3a through a parallel circuit of a resistor R2 and capacitor C2, whereby a chop-up type DC—DC converter is constituted.

The drive output terminal of the PWM circuit 3a is connected to the reset input terminal of the flip-flop circuit 5 through a first limiter circuit 6; the connection point between the switching transistor Q1 and the rectifying transistor Q2 is connected to the set input terminal of the flip-flop circuit 5 through a second limiter circuit 7; and the output terminal of the flip-flop circuit 5 is connected to the gate of the rectifying transistor Q2 through the drive circuit 8. In this way, the synchronous rectifying circuit according to the present invention is applied.

In the circuit arrangement of FIG. 6, a switching transistor Q1 comprising a PNP type transistor and a choke coil L1 are connected in series with each other between input terminal 1 and the ground, with the emitter of the switching transistor Q1 being at the input terminal 1 side; the collector of the switching transistor Q1 is connected to output terminal 2 through main current path of a rectifying transistor Q2 comprising an N channel type MOS FET; a smoothing capacitor C1 is provided between the output terminal 2 and the ground; and the base of the switching transistor Q1 is connected to the drive output terminal of a PWM circuit 3a through a parallel circuit of a resistor R2 and capacitor C2, whereby an invert type DC—DC converter is constituted.

The drive output terminal of the PWM circuit 3a is connected to set input terminal of a flip-flop circuit 5 through a first limiter circuit 6; and the output terminal of the flip-flop circuit 5 is connected to the gate of a rectifying transistor Q2 through a drive circuit 8. In this way, the synchronous rectifying circuit according to the present invention is applied.

The two embodiments of FIGS. 5 and 6 are identical to each other in terms of operation. Specifically, in the two embodiments, "on" drive signal of the switching transistor Q1 is detected by the first limiter circuit 6, and the rectifying transistor Q2 is turned on in response thereto; and output "off" operation of the switching transistor Q1 is detected by the second limiter circuit 7, and the rectifying transistor Q2 is turned on in response thereto. For the sake of simplification, detailed illustration of the respective circuit arrangements are omitted in FIGS. 5 and 6.

While the present invention has been illustrated and described with respect to specific embodiments thereof, it is to be understood that the present invention is by no means limited thereto, but that the present invention encompasses all changes and modifications which will become possible within the scope of the appended claims.

We claim:

1. A synchronous rectifying circuit for use with a switching power supply using a transistor as rectifying element, the rectifying transistor being arranged to be driven in synchronism with switching operation of switching element, said synchronous rectifying circuit comprising:

a first limiter circuit for detecting drive signal of said switching element;

a second limiter circuit for detecting operation of said switching element; and a flip-flop circuit for causing said rectifying transistor to be turned on or off in response to output signals of said first and second limiter circuits, wherein drive signal for turning on said switching element is detected, and said rectifying transistor is turned off in response thereto; and the turning-off of said switching element is detected, and said rectifying transistor is turned on in response thereto.

2. A synchronous rectifying circuit according to claim 1, wherein said rectifying transistor comprises a MOS FET.

3. A synchronous rectifying circuit according to claim 1, wherein each of said limiter circuits comprises a differentiating circuit receiving an input signal, and a transistor switch adapted to be driven by said differentiating circuit.

4. A synchronous rectifying circuit for use with a switching power supply using a transistor as rectifying element, the rectifying transistor being arranged to be driven in synchronism with switching operation of switching element, said synchronous rectifying circuit comprising:

a first limiter circuit comprising a differentiating circuit connected at input side to pulse output terminal of a control circuit for driving said switching element, and a transistor switch adapted to be operated in accordance with signal derived from said differentiating circuit;

a second limiter circuit comprising a differentiating circuit connected at input side to current output terminal of said switching element, and a transistor switch adapted to be operated in accordance with signal derived from said differentiating circuit;

a flip-flop circuit having a reset terminal connected to the current output terminal of the transistor switch of said first limiter circuit, and a set terminal connected to the current output terminal of the transistor switch of said second limiter circuit; and said rectifying transistor comprising an N channel type MOS FET and adapted to be operated in accordance with signal derived from said flip-flop circuit.

5. A synchronous rectifying circuit according to claim 4, wherein two transistors of different conductivity types are connected with each other in complementary fashion; a common connection point for bases of said two transistors is coupled to the output terminal of said flip-flop circuit; and a common connection point for main current paths of said two transistors is connected to a control terminal of said rectifying transistor.

* * * * *